(12) United States Patent
Yang et al.

(10) Patent No.: US 7,711,540 B2
(45) Date of Patent: May 4, 2010

(54) IN-CIRCUIT EMULATION SYSTEM WITH A PROGRAMMING FUNCTION

(75) Inventors: Tui-Yi Yang, Kaohsiung (TW); Wu-Shin Chen, Hsinchu (TW); Wen-Sheng Yiu, Taipei (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 499 days.

(21) Appl. No.: 11/727,533

(22) Filed: Mar. 27, 2007

(65) Prior Publication Data

US 2007/0236995 A1  Oct. 11, 2007

(30) Foreign Application Priority Data

Apr. 7, 2006  (TW) ............... 95112340 A

(51) Int. Cl.
*G06F 9/455* (2006.01)
(52) U.S. Cl. .......................... 703/28; 703/23
(58) Field of Classification Search .................. 703/24, 703/23, 28; 365/185.18
See application file for complete search history.

(56) References Cited

U.S. PATENT DOCUMENTS

| | | | | |
|---|---|---|---|---|
| 4,148,097 A * | 4/1979 | Deisch | ...................... | 363/26 |
| 4,588,239 A * | 5/1986 | Venaleck | ...................... | 439/74 |
| 5,134,702 A * | 7/1992 | Charych et al. | ............... | 710/71 |
| 5,731,731 A * | 3/1998 | Wilcox et al. | ............... | 327/403 |
| 5,877,656 A * | 3/1999 | Mann et al. | .................... | 331/16 |
| 5,982,160 A * | 11/1999 | Walters et al. | ............... | 323/282 |
| 6,139,341 A * | 10/2000 | Hun | ........................... | 439/172 |
| 6,377,034 B1 * | 4/2002 | Ivanov | ........................ | 323/287 |
| 6,381,159 B2 * | 4/2002 | Oknaian et al. | ............... | 363/98 |
| 6,499,122 B1 * | 12/2002 | Coomes | ...................... | 714/724 |
| 6,506,073 B2 * | 1/2003 | McCutchan et al. | ...... | 439/540.1 |
| 6,809,678 B2 * | 10/2004 | Vera et al. | .................... | 341/166 |
| 6,839,792 B2 * | 1/2005 | Feldstein et al. | ............ | 710/306 |
| 6,954,054 B2 * | 10/2005 | Brown | ........................ | 323/283 |
| 7,042,203 B2 * | 5/2006 | Van Der Horn et al. | ..... | 323/285 |
| 7,089,175 B1 * | 8/2006 | Nemecek et al. | .............. | 703/28 |
| 7,167,015 B2 * | 1/2007 | Borkar | ....................... | 324/760 |
| 7,239,117 B2 * | 7/2007 | Lee et al. | .................... | 323/283 |
| 7,459,894 B2 * | 12/2008 | Li et al. | ...................... | 323/285 |
| 7,479,772 B2 * | 1/2009 | Zane et al. | .................. | 323/272 |
| 7,558,093 B1 * | 7/2009 | Zheng | .......................... | 363/97 |

(Continued)

OTHER PUBLICATIONS

Unknown, Pice-52 User's Manual, 2000, Phyton, Inc.*

*Primary Examiner*—Paul L Rodriguez
*Assistant Examiner*—Aniss Chad
(74) *Attorney, Agent, or Firm*—Bacon & Thomas, PLLC

(57) ABSTRACT

An in-circuit emulation system with a programming function includes a system power supply, a DC/DC converter, a processing device, a programmer socket and a connector. The system power supply produces a first DC voltage. The DC/DC converter converts the first DC voltage into a second DC voltage and a third DC voltage. The processing device has a processor and a parallel/serial converter. For executing a programming function, the processor uses the parallel/serial converter to convert programming codes into corresponding programming signals. The programmer socket receives the programming signals, the second DC voltage and the third DC voltage to accordingly execute a programming function on an IC plugged in the socket. The connector has one end connected to the processing device and the other end connected to a target board to thereby drive and receive electrical signals of the target board on performing an in-circuit emulation.

11 Claims, 5 Drawing Sheets

U.S. PATENT DOCUMENTS

2002/0074975 A1* 6/2002 Culpepper et al. .......... 323/222
2004/0075600 A1* 4/2004 Vera et al. .................. 341/166
2005/0052196 A1* 3/2005 Borkar ....................... 324/760
2006/0145675 A1* 7/2006 Lee et al. ................... 323/282

* cited by examiner

IN-CIRCUIT EMULATION SYSTEM WITH A PROGRAMMING FUNCTION

BACKGROUND OF THE INVENTION

1. Field of the Invention

The invention relates to the technical field of integrated circuit (IC) programming and in-circuit emulation (ICE) and, more particularly, to an in-circuit emulation with a programming function.

2. Description of Related Art

FIG. 1 is a block diagram of a conventional universal device programmer. As shown in FIG. 1, the programmer includes a control logic 105, a memory 110, a transmission interface 115, a peripheral input and output interface 120, a microprocessor 125, a programmer socket 130, a system power supply 135, and a DC/DC converter 140. When an IC 160 is to be programmed, the IC 160 is placed in the programmer socket 130, and a programming code is downloaded from a personal computer 150 to the microprocessor 125 via the transmission interface 115 for being stored in the memory 110. Subsequently, the microprocessor 125 produces a special control signal based on the programming code and executes a programming function on the IC 160 via the programmer socket 130.

The typical programmer uses a general-purpose input-output (GPIO) pin of the microprocessor 125 to simulate and generate timing of control signals. Such a configuration requires the external devices to support and expand the programming capacity so as to increase the hardware cost. In addition, the corresponding firmware design is complicated, and the management and maintenance take much time. Further, such a complicated design has a low integration and cannot be used with the development tools of the microprocessor 125. Therefore, it is desirable to provide an improved in-circuit emulation system to mitigate and/or obviate the aforementioned problems.

SUMMARY OF THE INVENTION

An object of the invention is to provide an in-circuit emulation (ICE) system with a programming function, which can support and expand the programming capacity without using external devices and can overcome the increased hardware cost.

Another object of the invention is to provide an in-circuit emulation (ICE) system with a programming function, which can reduce the complexity of the programming firmware design and overcome the prior problem of taking much time on the management and maintenance.

A further object of the invention is to provide an in-circuit emulation (ICE) system with a programming function, which integrates the programmer and the ICE in order to use with the development tools of the microprocessor and reduce the entire cost and a learning curve of the programmer and ICE.

A further another object of the invention is to provide an in-circuit emulation (ICE) system with a programming function, which collectively places pins of the programmer to a fixed location for providing programming voltages and signals to thereby reduce the complexity of the system software and hardware design.

A still another object of the invention is to provide an in-circuit emulation (ICE) system with a programming function, which collectively places pins of the programmer to a fixed location in order to provide a user to establish a consistent habitual on programming and avoid the operation errors.

To achieve the objects of the invention, there is provided an in-circuit emulation (ICE) system with a programming function. The ICE system includes a system power supply, a DC/DC converter, a processing device, a programmer socket and a connector. The system power supply produces a first DC voltage for use as a system power. The DC/DC converter is connected to the system power supply in order to change the first DC voltage into a second DC voltage and a third DC voltage that are provided for programming an integral circuit (IC), wherein the second and the third DC voltages are higher than the first DC voltage. The processing device has a processor and a parallel/serial converter. The processor performs an in-circuit emulation and executes a programming function. For executing the programming function, the processor uses the parallel/serial converter to convert programming codes into corresponding programming signals. The programmer socket is connected to the DC/DC converter and the parallel/serial converter in order to receive the programming signals, the second DC voltage and the third DC voltage to accordingly execute the programming function on the IC plugged in the socket. The connector has one end connected to the processing device and the other end connected to a target board to thereby drive and receive electrical signals of the target board on performing the in-circuit emulation.

The ICE system further comprises a clock generator connected to the processing device in order to provide a clock to the ICE system.

The ICE system further comprises a transmission module coupled between the processing device and a personal computer in order to download the programming codes or program codes of the in-circuit emulation from the personal computer to the processing device or upload the electrical signals of the target board on performing the in-circuit emulation from the processing device to the personal computer.

In the ICE system, the processing device further comprises an internal storage to temporarily store the programming code, the program codes or the electrical signals.

In the ICE system, the processing device further comprises a set of control registers such that the processor performs a write operation on the set of control registers when the ICE system executes the programming function, to thereby set a programming timing and activate the parallel/serial converter.

In the ICE system, the clock generator is a crystal or an oscillator.

In the ICE system, the transmission module is a USB transmission module or a printer port transmission module.

In the ICE system, the first DC voltage is 5V, the second DC voltage is 6V, and the third DC voltage is 13V.

In the ICE system, the programmer socket is a dual in-line package (DIP).

The ICE system uses the parallel/serial converter to generate a serial clock and a serial data, and uses the programmer socket to output the second DC voltage, the third DC voltage, the serial clock and the serial data, to thereby execute the programming function on the IC plugged in the programmer socket.

In the ICE system, the DIP programmer socket has N pins, and the second DC voltage, the third DC voltage, the serial clock and the serial data are arranged at the N-th, (N−4)-th, (N−2)-th and (N−3)-th pins respectively.

The ICE system further comprises an adapter to convert the DIP programmer socket into a small out-line package (SOP) programmer socket.

DETAILED DESCRIPTION OF THE PREFERRED EMBODIMENT

Figure 1:
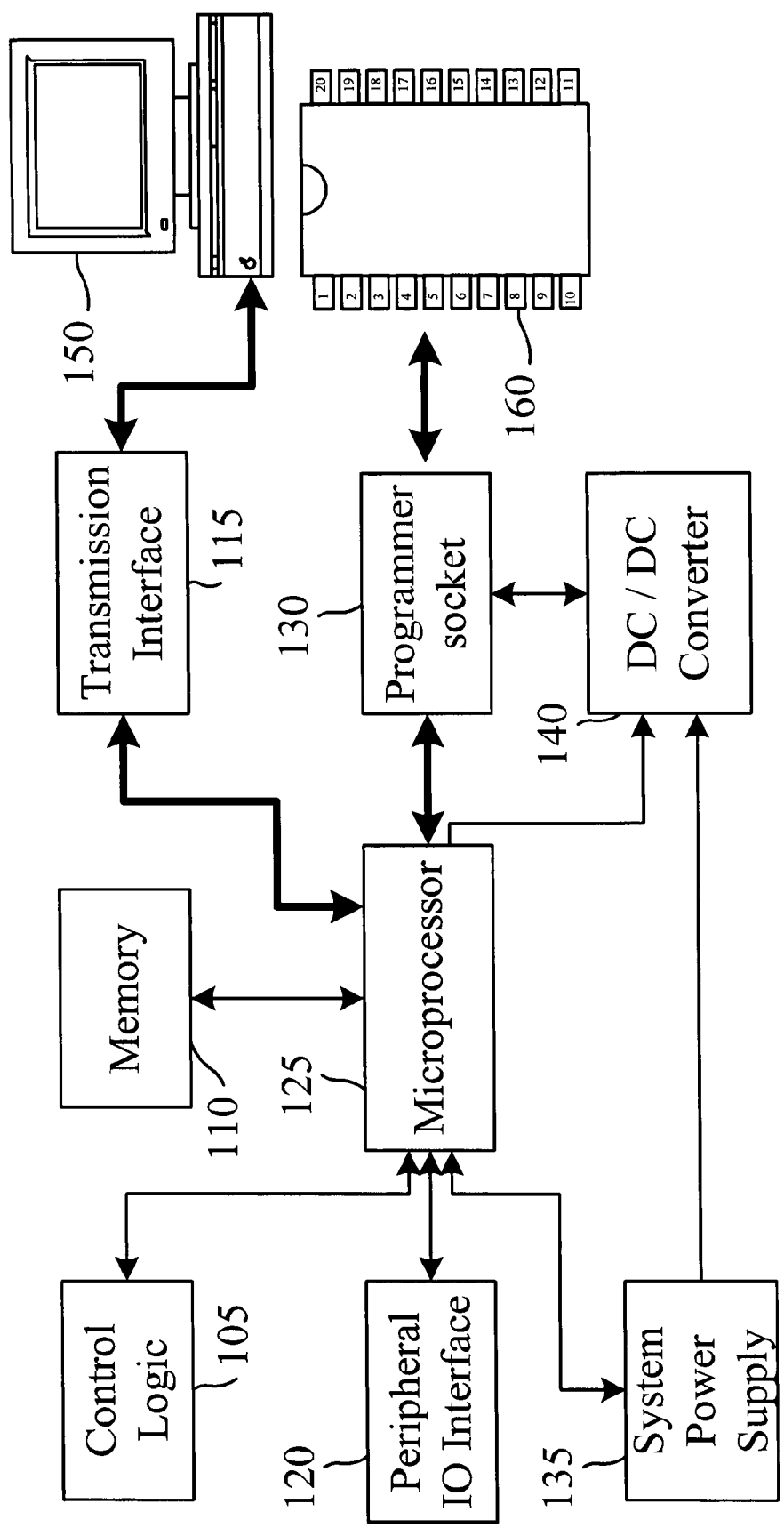
FIG. 1 is a block diagram of a conventional universal device programmer.
Figure 2:
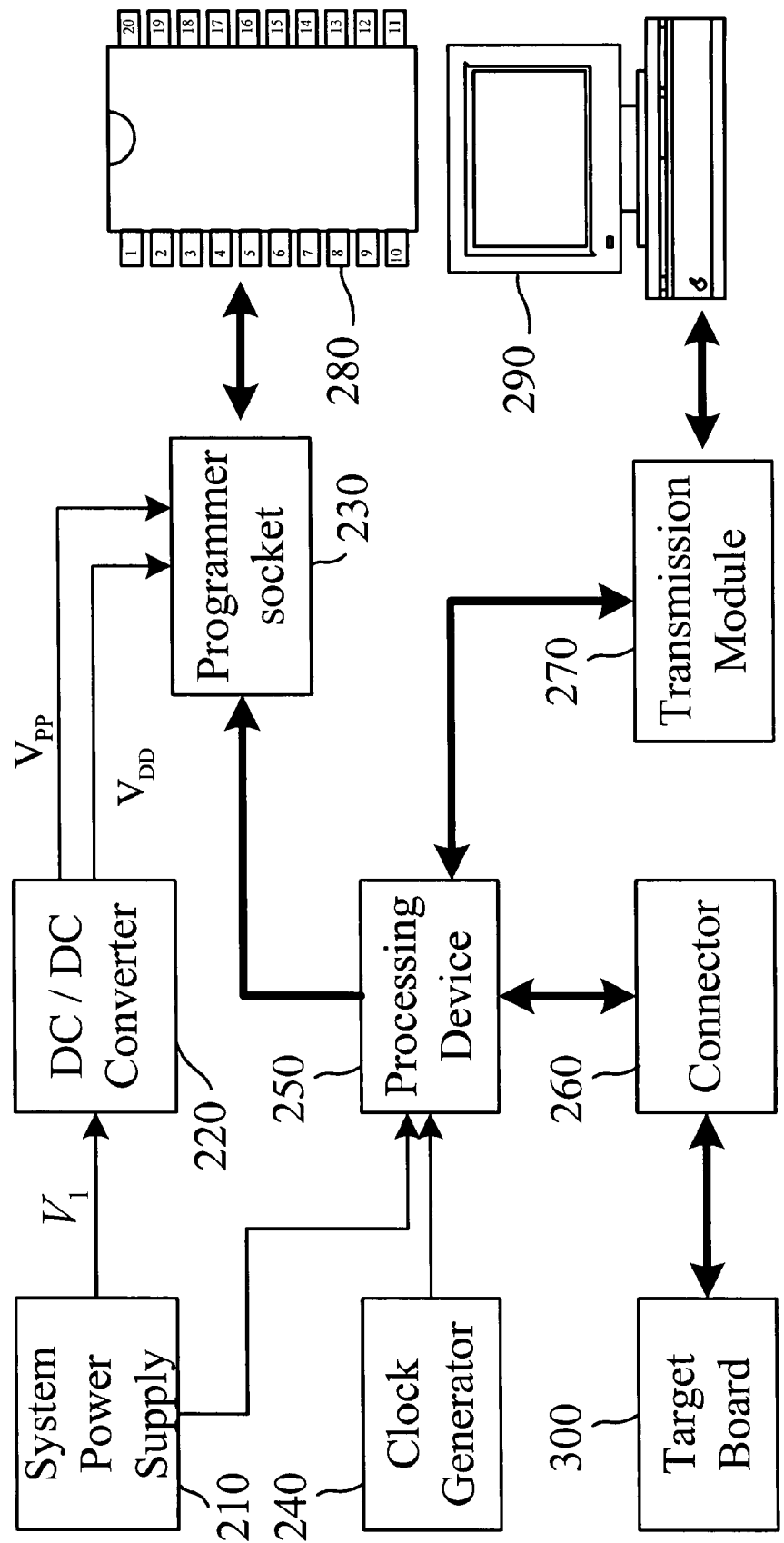
FIG. 2 is a block diagram of an in-circuit emulation (ICE) system with a programming function in accordance with the invention.

FIG. 2 is a block diagram of an in-circuit emulation (ICE) system with a programming function in accordance with the invention. As shown in FIG. 2, the ICE system includes a system power supply 210, a DC/DC converter 220, a processing device 250, a programmer socket 230, a connector 260, a clock generator 240 and a transmission module 270.

The system power supply 210 produces a first DC voltage $V_1$ for use as a system power. The first DC voltage is preferred 5V. The DC/DC converter 220 is connected to the system power supply 210 in order to change the first DC voltage $V_1$ into a second DC voltage $V_{PP}$ and a third DC voltage $V_{DD}$ that are provided for programming an IC 280, wherein both the second and the third DC voltages $V_{PP}$ and $V_{DD}$ are higher than the first DC voltage V. The second DC voltage $V_{PP}$ is preferred 6V, and the third DC voltage $V_{DD}$ is preferred 13V.

Figure 3:
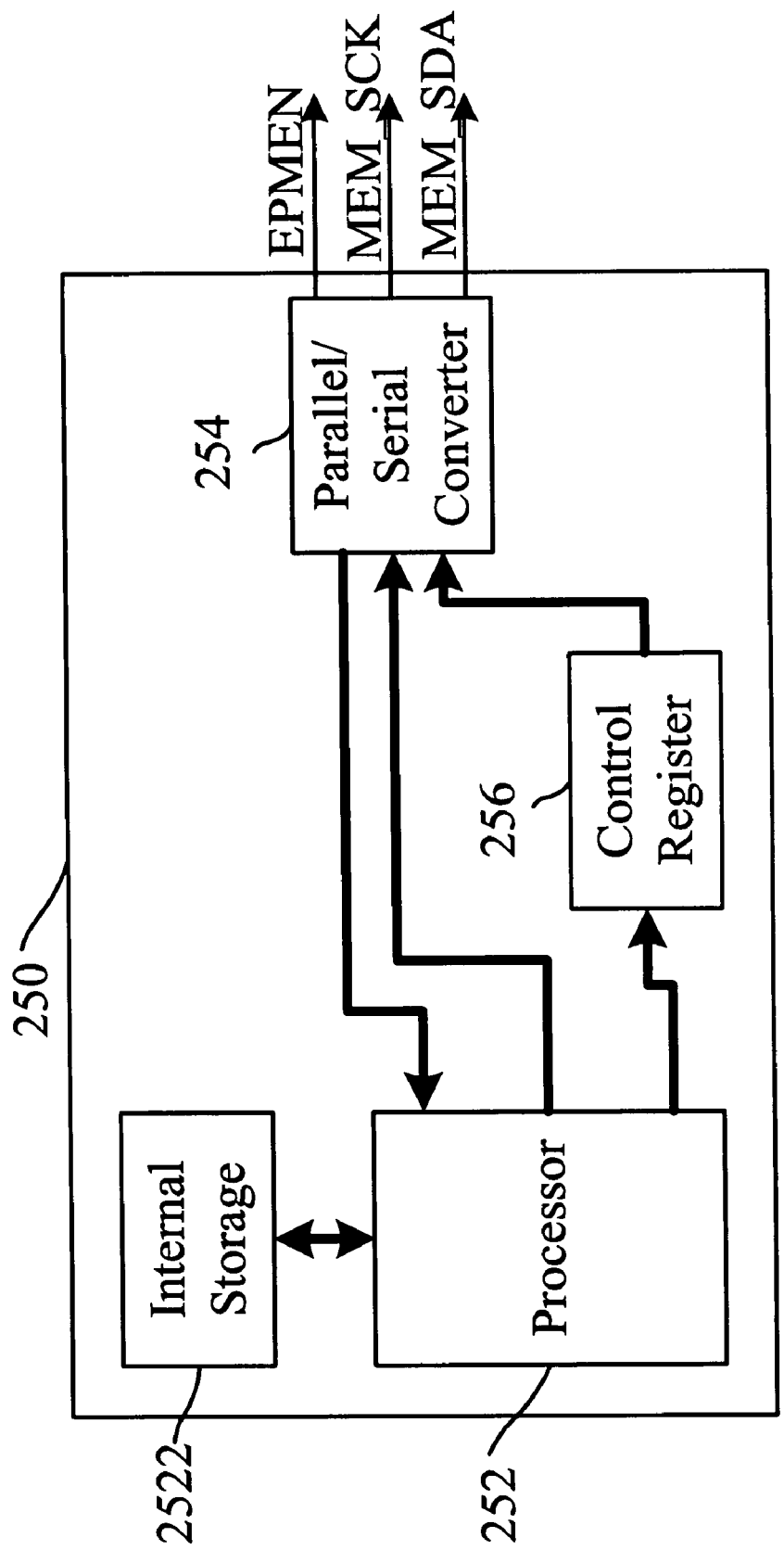
FIG. 3 is a block diagram of a processing device in accordance with the invention.

FIG. 3 is a block diagram of the processing device 250 in accordance with the invention. As shown in FIG. 3, the processing device 250 has a processor 252, a parallel/serial converter 254 and a set of control registers 256. The processor 252 executes the functions of in-circuit emulation and device programming. When the processor 252 executes a programming function, it uses the parallel/serial converter 254 to convert programming codes into corresponding programming signals. The processor 252 further has an internal storage 2522 to temporarily store the programming codes, program codes for an in-circuit emulation, and electrical signals on a target board 300. The internal storage 2522 is preferred an embedded SRAM.

When the ICE system executes the programming function, the processor 252 performs a write-in operation on the set of control registers 256 for setting timing parameters for the programming signals when the IC 280 is programming, and activating the parallel/serial converter.

The clock generator 240 is connected to the processing device 250 in order to provide a clock to the ICE system. The clock generator 240 can be a crystal or an oscillator.

The transmission module 270 is coupled between the processing device 250 and a personal computer 290 in order to download the programming codes or the program codes of an in-circuit emulation from the personal computer 290 to the processing device 250, or upload the electrical signals of the target board 300 on performing the in-circuit emulation from the processing device 250 to the personal computer 290. The transmission module 270 is a USB or printer port transmission module.

When the ICE system performs the programming function, the programming codes for the IC 280 is downloaded from the personal computer 290 to the processing device 250 through the transmission module 270. The processing device 250 stores the programming codes in the internal storage 2522. Subsequently, the processor 252 performs a write-in operation on the set of control registers 256 for setting timing parameters for the programming signals when the IC 280 is programming, and activating the parallel/serial converter 254 to produce the timing for accordingly performs a programming operation on the IC 280.

The programmer socket 230 is connected to the DC/DC converter 220 and the parallel/serial converter 254 in order to receive the programing signals, the second DC voltage $V_{DD}$ and the third DC voltage $V_{PP}$ for programming a IC 280 currently plugged in the socket. In this embodiment, the programmer socket 230 is a dual in-line package (DIP).

Figure 4:
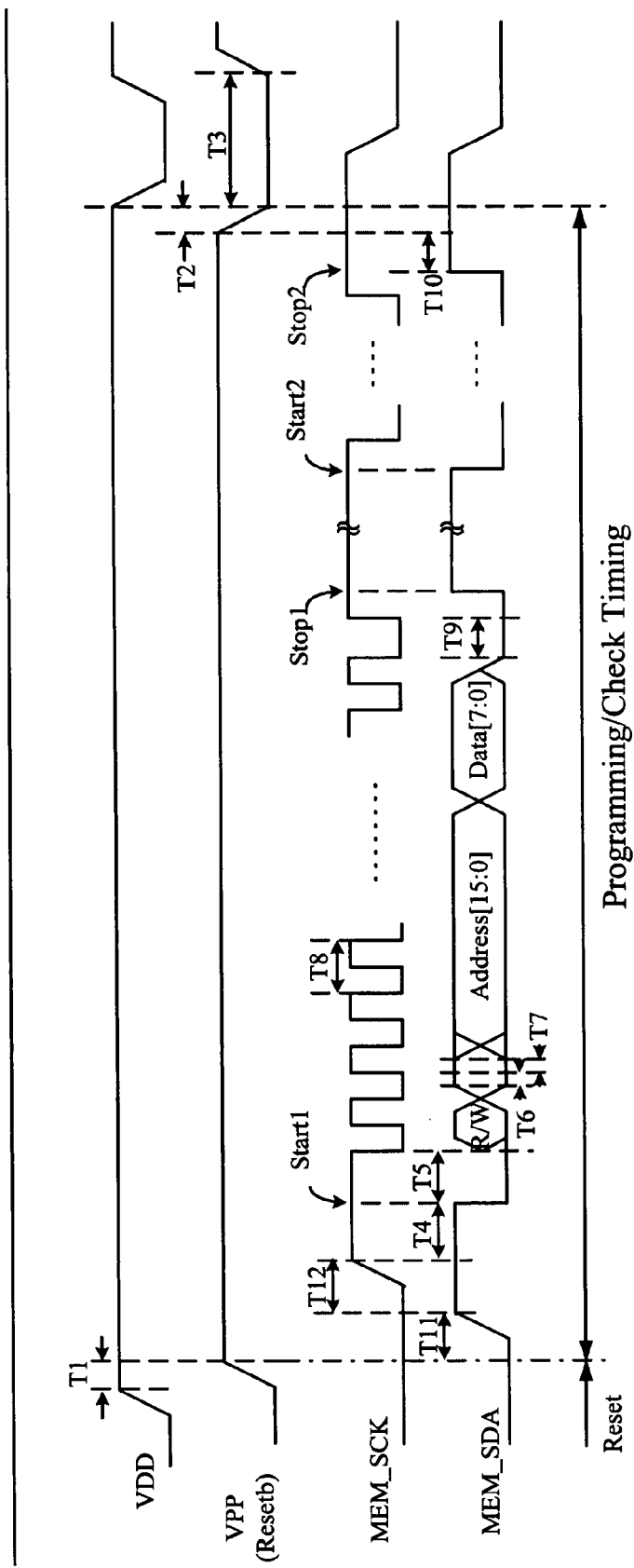
FIG. 4 is a timing diagram of executing a programming function by the ICE system of FIG. 2 in accordance with the invention.

FIG. 4 is a timing diagram of executing a programming function by the ICE system of FIG. 2 in accordance with the invention. As shown in FIG. 4, the programming signals include the signals MEM_SCK and MEM_SDA. The signals MEM_SCK and MEM_SDA produced by the parallel/serial converter 254 are a serial clock and a serial data.

The parallel/serial converter 254 produces the serial clock signal MEM_SCK and the serial data MEM_SDA. The programmer socket 230 outputs the second DC voltage $V_{DD}$, the third DC voltage $V_{PP}$, the serial clock MEM_SCK and the serial data MEM_SDA, to thereby execute the programming function on the IC 280 currently plugged in the programmer socket 230.

Figure 5:
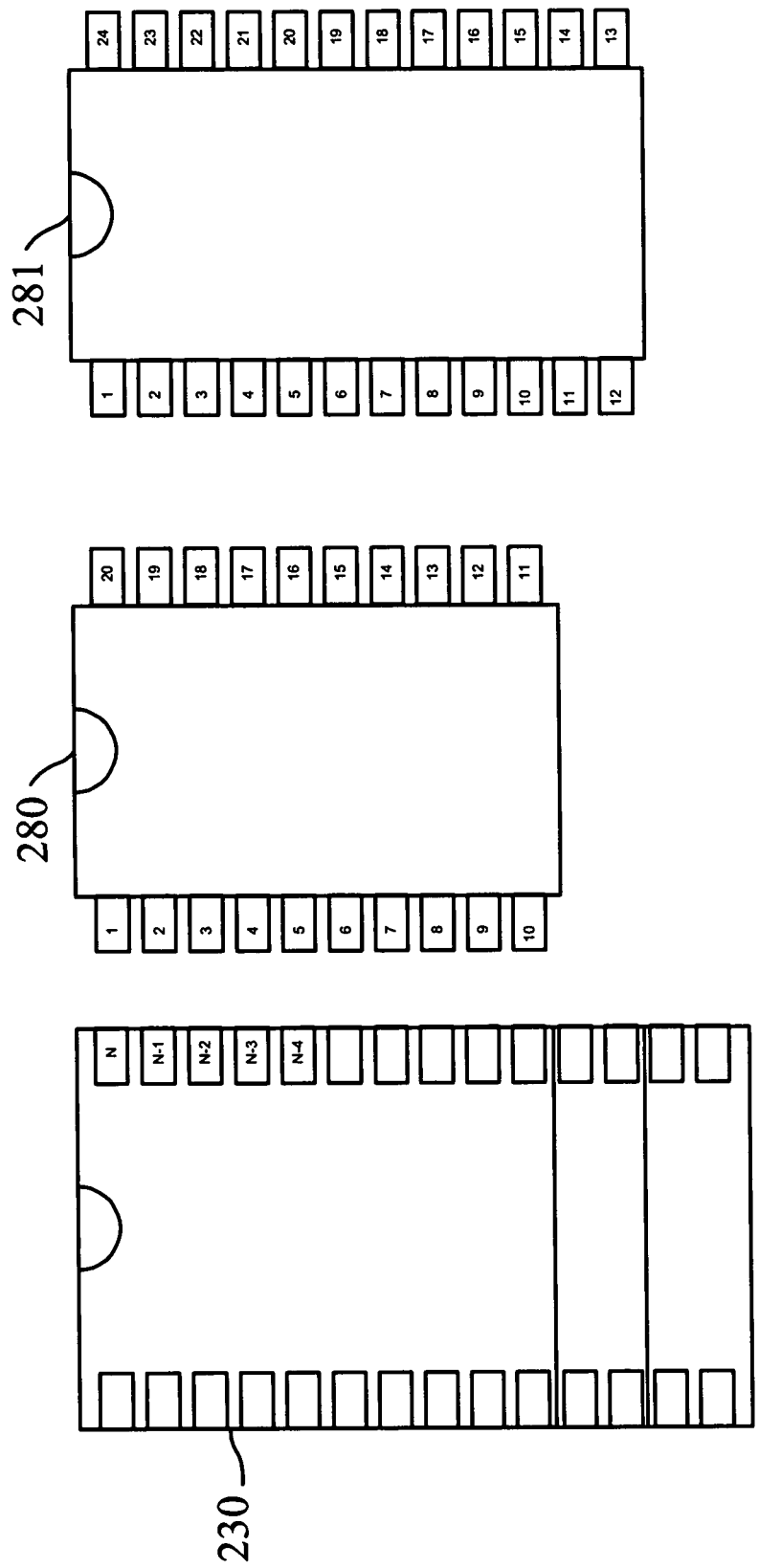
FIG. 5 is a schematic view of a pin arrangement of a programmer socket in accordance with the invention.

FIG. 5 is a schematic view of a pin arrangement of the DIP programmer socket 230 in accordance with the invention. As shown in FIG. 5, the DIP programmer socket 230 has N pins. The second DC voltage $V_{DD}$, the third DC voltage $V_{PP}$, the serial clock MEM_SCK and the serial data MEM_SDA are arranged at the N-th, (N−4)-th, (N−2)-th and (N−3)-th pins respectively. Take N=20 for example. When the IC 280 is a 20-pin DIP package, the 20-th, 16-th, 18-th, 17-th pins correspond to the second DC voltage $V_{DD}$, the third DC voltage $V_{PP}$, the serial clock MEM_SCK and the serial data MEM_SDA of the socket 230, respectively. Take N=24 for example. When the IC 280 is a 24-pin DIP package, the 24-th, 20-th, 22-th, 21-th pins correspond to the second DC voltage $V_{DD}$, the third DC voltage $V_{PP}$, the serial clock MEM_SCK and the serial data MEM_SDA of the socket 230, respectively. Accordingly, the arrangement for a 28- or 32-pin DIP IC package is similar and not described any more.

The pins of such an arrangement are collectively placed to a fixed location such that the programmer socket 230 can provide the programming voltages and signals to the fixed pins, which provides a simpler configuration design of software and hardware without designing many adapters and accordingly reduce the cost and the management and maintenance problem. In addition, the fixed pins provide a user to establish a consistent habitual on programming and avoid the operation errors.

In such a pin arrangement of the invention, the pins of the signals MEM_SCK and MEM_SDA are arranged between the pins of the second and third DC voltages $V_{DD}$ and $V_{PP}$ to thereby prevent the signals MEM_SCK and MEM_SDA from the noise interference and enhance the noise-proof capability on programming the IC 280, to further avoid the programming failure.

The ICE system further has an adapter to convert the DIP programmer socket into a small out-line package (SOP) programmer socket or another type of programmer socket for adapting various package type ICs.

The connector 260 has one end connected to the processing device 250 and the other end connected to the target board 300 in order to drive and receive the electrical signals on the target board by the ICE system on performing the in-circuit emulation, For performing the in-circuit emulation, the ICE system downloads a program code from the personal computer 290 to the processing device 250 through the transmission module 270. The processing device 250 stores the program code in a special location in the internal storage 2522, and subsequently resets the processor 252 in order to force the processor to be in a known state. After the reset, the processor 252 reads the program code from the special location to execute.

In view of the foregoing, it is known that the invention integrates the internal storage 2522 into the processor 252, and accordingly the programming capacity can be expanded without the support of external devices, which overcomes the problem of increasing the hardware cost. In addition, the integrated programmer and in-circuit emulator can be used with the development tools of the microprocessor, so as to reduce the entire cost and the learning curve of programmer and in-circuit emulator, which leads the programming firmware design to a reduced complexity and overcomes the problem of taking much time on the management and maintenance. In the ICE system, the pins of the programmer socket are collectively placed on a fixed location to provide the required programming voltages and signals at the respectively fixed pins, which further reduces the complexity of system software and hardware design and provides a user to establish a consistent habitual on programming to thereby avoid the operation errors.

Although the present invention has been explained in relation to its preferred embodiment, it is to be understood that many other possible modifications and variations can be made without departing from the spirit and scope of the invention as hereinafter claimed.

What is claimed is:

1. An in-circuit emulation (ICE) system with a programming function, comprising:
    a system power supply, which produces a first direct current (DC) voltage for use as a system power;
    a DC/DC converter, which is connected to the system power supply in order to change the first DC voltage into a second DC voltage and a third DC voltage that are provided for programming an integral circuit, wherein both the second voltage and the third DC voltage are higher than the first DC voltage;
    a processing device, which has a processor and a parallel/serial converter, the processor performing an in-circuit emulation and executing a programming function, wherein the processor uses the parallel/serial converter to convert programming codes into corresponding programming signals for executing the programming function;
    a programmer socket, which is connected to the DC/DC converter and the parallel/serial converter in order to receive the programming signals, the second DC voltage and the third DC voltage to accordingly execute the programming function on the integrated circuit plugged in the socket; and
    a connector, which has a first end connected to the processing device and a second end connected to a target board to thereby drive and receive electrical signals of the target board on performing the in-circuit emulation.

2. The in-circuit emulation system as claimed in claim 1, further comprising a timing generator, which is connected to the processing device in order to provide a clock to the in-circuit emulation system.

3. The in-circuit emulation system as claimed in claim 1, further comprising a transmission module, which is connected to the processing device and a personal computer in order to download the programming codes or program codes of the in-circuit emulation from the personal computer to the processing device or upload the electrical signals of the target board on performing the in-circuit emulation from the processing device to the personal computer.

4. The in-circuit emulation system as claimed in claim 3, wherein the processing device further comprises an internal storage to temporarily store the programming codes, the program codes or the electrical signals.

5. The in-circuit emulation system as claimed in claim 4, wherein the processing device further comprises a set of control registers such that the processor performs a write operation on the set of control registers when the in-circuit emulation system executes the programming function, to thereby set a programming timing and activate the parallel/serial converter.

6. The in-circuit emulation system as claimed in claim 2, wherein the timing generator is a crystal or an oscillator.

7. The in-circuit emulation system as claimed in claim 3, wherein the transmission module is a USB or a printer port transmission module.

8. The in-circuit emulation system as claimed in claim 1, wherein the first DC voltage is 5V, the second DC voltage is 6V, and the third DC voltage is 13V.

9. The in-circuit emulation system as claimed in claim 1, wherein the programmer socket is a dual in-line package (DIP).

10. The in-circuit emulation system as claimed in claim 9, wherein the programming signals produced by the parallel/serial converter include a serial clock and a serial data when the programming function is executed, and the programmer socket outputs the second DC voltage, the third DC voltage, the serial clock and the serial data, to thereby execute the programming function on the IC plug therein.

11. The in-circuit emulation system as claimed in claim 10, wherein the programmer socket has N pins, where the second DC voltage, the third DC voltage, the serial clock and the serial data are arranged at the N-th, (N−4)-th, (N−2)-th and (N−3)-th pins respectively.

* * * * *